United States Patent [19]

Sasaki

[11] Patent Number: 5,051,372
[45] Date of Patent: Sep. 24, 1991

[54] METHOD OF MANUFACTURING A SEMICONDUCTOR OPTOELECTRIC INTEGRATED CIRCUIT DEVICE, HAVING A PIN, HEMT, AND HBT, BY SELECTIVE REGROWTH

[75] Inventor: Goro Sasaki, Yokohama, Japan

[73] Assignee: Sumitomo Electric Industries, Ltd., Osaka, Japan

[21] Appl. No.: 507,530

[22] Filed: Apr. 11, 1990

[30] Foreign Application Priority Data

| Apr. 12, 1989 | [JP] | Japan | 1-92690 |
| Apr. 12, 1989 | [JP] | Japan | 1-92691 |
| Apr. 12, 1989 | [JP] | Japan | 1-92692 |
| Apr. 25, 1989 | [JP] | Japan | 1-104992 |
| Apr. 25, 1989 | [JP] | Japan | 1-104993 |

[51] Int. Cl.$^5$ .......................... H01L 31/18
[52] U.S. Cl. .......................... 437/5; 437/3;
437/51; 437/90; 437/133; 437/89; 148/DIG.
72; 148/DIG. 103; 357/56; 372/50; 385/14
[58] Field of Search ............ 437/5, 3, 51, 90, 133,
437/89; 148/DIG. 72, DIG. 103; 357/56;
372/50; 350/96.11

[56] References Cited

U.S. PATENT DOCUMENTS

| 4,396,443 | 8/1983 | Lewerenz et al. | 437/5 |
| 4,800,262 | 1/1989 | Lentine | 357/4 |
| 4,868,633 | 9/1989 | Plumton et al. | 357/34 |
| 4,904,607 | 2/1990 | Riglet et al. | 437/5 |
| 4,996,163 | 2/1991 | Sasaki et al. | 437/5 |

Primary Examiner—Brian E. Hearn
Assistant Examiner—Gordon V. Hugo
Attorney, Agent, or Firm—Beveridge, DeGrandi & Weilacher

[57] ABSTRACT

There is disclosed a method of manufacturing an integrated circuit, comprising: the first step of growing a first epitaxial crystal on a compound semiconductor substrate, removing an unnecessary region of the first epitaxial crystal to form a residual portion, and covering the residual portion with a selective growth mask, the second step of growing a second epitaxial crystal on an exposed substrate portion, removing an unnecessary portion of the second epitaxial crystal to form a residual portion of the second epitaxial crystal, and covering the residual portion of the second epitaxial crystal with a selective growth mask, and third step of growing a third epitaxial crystal on an exposed substrate portion and removing an unnecessary region of the third epitaxial crystal, wherein the first to third epitaxial crystal form any one of a pin photodiode crystal, a heterojunction bipolar transistor crystal, and a high electron mobility transistor crystal, and are different from each other.

12 Claims, 18 Drawing Sheets

METHOD OF MANUFACTURING A SEMICONDUCTOR OPTOELECTRIC INTEGRATED CIRCUIT DEVICE, HAVING A PIN, HEMT, AND HBT, BY SELECTIVE REGROWTH

BACKGROUND OF THE INVENTION

1. Field of the Invention

The present invention relates to a method of manufacturing a semiconductor integrated circuit device having, as basic elements, optical and electronic elements integrated to form an opto-electrical semiconductor integrated circuit used for optical fiber communication and the like.

2. Related Background Art

A structure obtained by integrating pin photodiodes (PIN-PDs) as light-receiving elements and field effect transistors (FETs) as electronic elements on a substrate is known as a reception front end in optical fiber communication.

Another conventional structure is also known in which PIN-PDs and FETs are monolithically formed on an InP substrate.

The structure having the light-receiving and electronic elements formed on a substrate is formed by soldering the respective elements on the substrate. Reliability of this structure is poorer than a monolithic structure, and the hybrid type structure is not suitable for mass production.

The conventional monolithic structure described above does not have bipolar transistors. A reception front end in optical fiber communication preferably has FETs having a high input impedance and low shot noise at its first signal amplification stage. In the subsequent stages, bipolar transistors having a large transconductance are preferably used. Therefore, strong demand has arisen for a monolithic semiconductor integrated circuit in which PIN-PDs, FETs, and bipolar transistors are formed on a single substrate, but such a semiconductor integrated circuit has not yet been developed.

SUMMARY OF THE INVENTION

It is an object of the present invention to provide a method of manufacturing a semiconductor integrated circuit in which PIN-PDs, FETs, and bipolar transistors are monolithically formed on a single semiconductor substrate.

It is another object of the present invention to provide a method of manufacturing a semiconductor integrated circuit, comprising: the first step of growing a first epitaxial crystal on a compound semiconductor substrate, removing an unnecessary region of the first epitaxial crystal to form a residual portion, and covering the residual portion with a selective growth mask; the second step of growing a second epitaxial crystal on an exposed substrate portion, removing an unnecessary portion of the second epitaxial crystal to form a residual portion of the second epitaxial crysal, and covering the residual portion of the second epitaxial crystal with a selective growth mask; and the third step of growing a third epitaxial crystal on an exposed substrate portion and removing an unnecessary region of the third epitaxial crystal, wherein the first to third epitaxial crystals form any one of a pin photodiode crystal, a heterojunction bipolar transistor crystal, and a high electron mobility transistor crystal, and are different from each other.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 1:
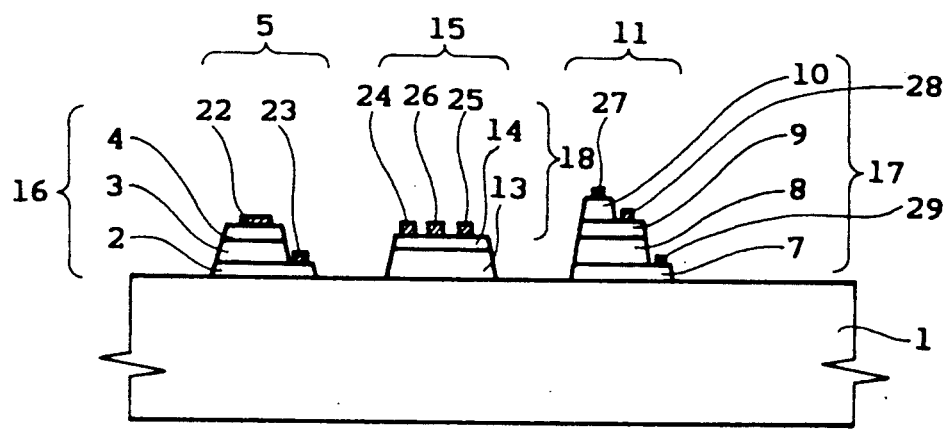
FIG. 1 is a sectional view showing an example of a semiconductor integrated circuit device obtained by a method of manufacturing a semiconductor integrated circuit device according to the present invention.

FIG. 1 shows a sectional structure of an example of a semiconductor integrated circuit device manufactured by a method of manufacturing a semiconductor integrated circuit device according to the present invention. As shown in FIG. 1, epitaxial crystals for a PIN-PD 16, a high electron mobility transistor (HEMT) 18 as a kind of FET, and a heterojunction bipolar transistor (HBT) 17 are monolithically formed on an indium phosphide (InP) substrate 1. The epitaxial crystals for PIN-PD 16, HEMT 18 and HBT 17 are respectively constructed by semiconductor layers 2, 3 and 4, semiconductor layers 13 and 14, and semiconductor layers 7, 8, 9 and 10. Further electrodes 22 and 23 for PIN-PD 16 are as shown in FIG. 1 formed on the semiconductor layers 4 and 2, electrodes 24, 25 and 26 for HEMT 18 are formed on the layer 14, and electrodes 27, 28 and 29 are formed on the epitaxial layers 10, 9 and 7. Organic metal vapor phase epitaxy (OMVPE) as an epitaxial growth method of forming the above epitaxial crystals is performed at a low pressure of 100 Torr or less which exhibits good selective growth. A substrate temperature is set to be about 600° C. to 700° C., and reaction gases are properly selected in accordance with semiconductor layers to be formed. Semiconductor layers formed by epitaxial growth are in InP layer, a gallium-indium arsenide (GaInAs) layer, and an aluminum-indium arsenide (AlInAs) layer. These semiconductor layers are selectively used in accordance with the types of elements.

Thrimethylindium (TMI), phosphine (PH$_3$), and arsine (AsH$_3$) are used as reaction gases in epitaxial growth of an InP layer. Trimethylgallium (TMG), trimethylindium (TMI), and arsine (AsH$_3$) are used as reaction gases in epitaxial growth of a GaInAs layer. Trimethylaluminum (TMA), trimethylindium (TMI), and arsine (AsH$_3$) are used as reaction gases in epitaxial growth of an AlInAs layer.

The epitaxial crystals for PIN-PD 16, HEMT 18 and HBT 17 are independently formed and when one of the crystals is formed, the others are covered by a selective growth mask.

A silicon nitride (SIN$_x$) film or a silicon oxide (siO$_2$) film is used as the selective growth mask to be described below.

The steps in manufacturing a semiconductor integrated circuit device shown in FIG. 1 according to a method of the first embodiment will be described with reference to FIGS. 2A to 2I. In the method of the first embodiment, the PIN-PD 16, the HEMT 18, and the HBT 17 are formed in the order named.

Figure 2A:
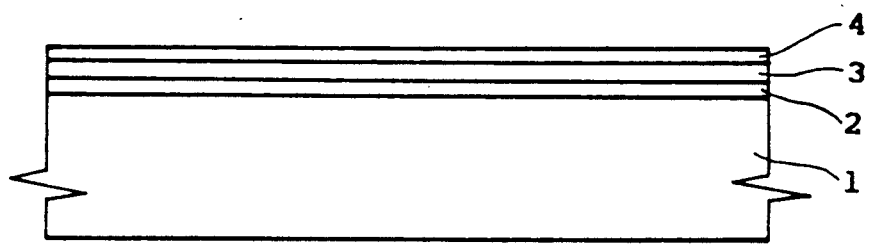
FIGS. 2A to 2I are sectional views for explaining the steps in manufacturing a semiconductor integrated circuit device according to a method of the first embodiment of the present invention.

Epitaxial growth for PIN-PD formation is performed on the prepared InP substrate 1. In this case, an n-type GaInAs layer 2, an i-type GaInAs layer 3, and a p-type GaInAs layer 4 are formed in the order named (FIG. 2A).

Figure 2B:
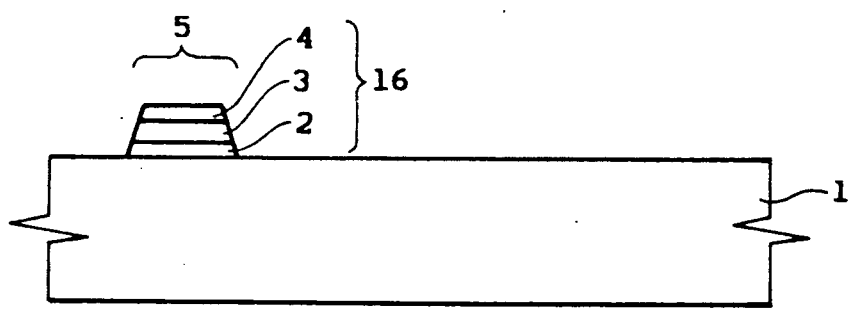

Mesa etching is performed such that the epitaxial layers 2 and 3 are left on only a prospective PIN-PD formation region 5 (FIG. 1). For this purpose, a silicon nitride film is formed on the entire surface of the substrate by, e.g., electron cyclotron resonance plasma chemical vapor deposition (ECR plasma CVD). A resist pattern is formed on the surface of the prospective PIN-PD region 5, and the silicon nitride film is etched with hydrofluoric acid (HF) by using the resist pattern as a mask. The epitaxial layers 2 and 4 are sequentially etched using the residual silicon nitride film and the residual resist pattern on the prospective PIN-PD region 5 as masks. The resist pattern and the residual silicon nitride film which are used as the masks are removed to form the PIN-PD crystal 16 (FIG. 2B).

Figure 2C:
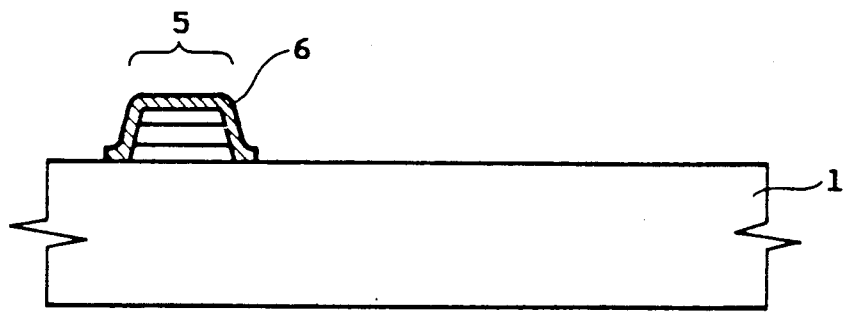

A selective growth mask 6 made of a silicon nitride or oxide film is formed in the PIN-PD region 5. This mask 6 is formed by growth by means of ECR plasma CVD and patterning using a resist pattern in the same manner as the silicon nitride masks as in the above mesa etching (FIG. 2C).

Figure 2D:
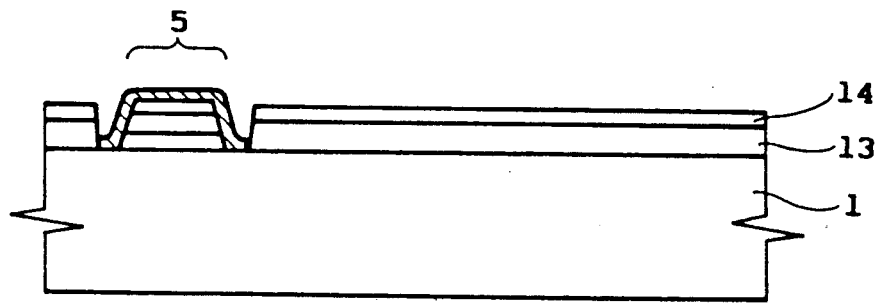
Figure 2E:
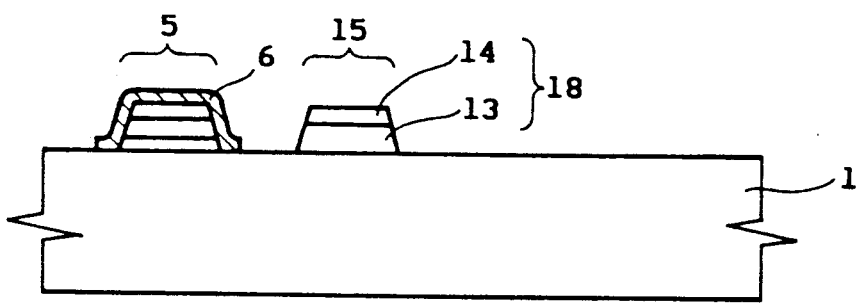
Figure 2F:
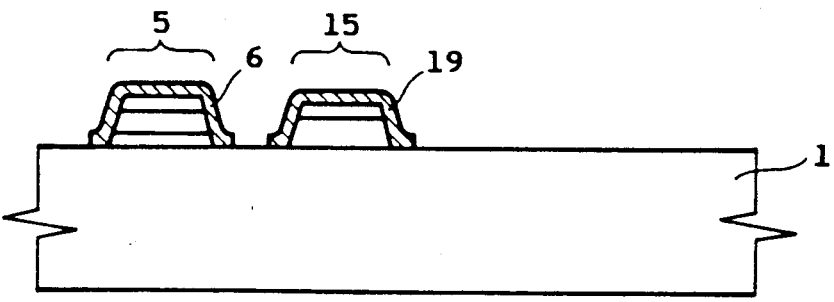

Selective epitaxial growth for an HEMT is then performed. More specifically, an i-type GaInAs layer 13 serving as an active layer and an n-type AlInAs layer 14 serving as an electron donor layer are sequentially formed on the entire surface except for the selective growth mask 6 (FIG. 2D). Mesa etching is performed to leave the epitaxial layers 13 and 14 on only a prospective HEMT formation region 14, thereby forming an HEMT crystal 18 (FIG. 2E). This mesa etching is the same as that in the PIN-PD region 5 and includes the step of forming a silicon nitride or oxide film by ECR plasma CVD, the step of patterning the silicon nitride or oxide film, and the etching step using the patterned film. A selective growth mask 19 consisting of a silicon nitride or oxide film is formed in the prospective HEMT region 15. The selective growth mask 6 is left in the PIN-PD region 5. The selective growth mask 19 is also formed by film formation by means of ECR plasma CVD and patterning using a resist pattern as a mask (FIG. 2F).

Figure 2G:
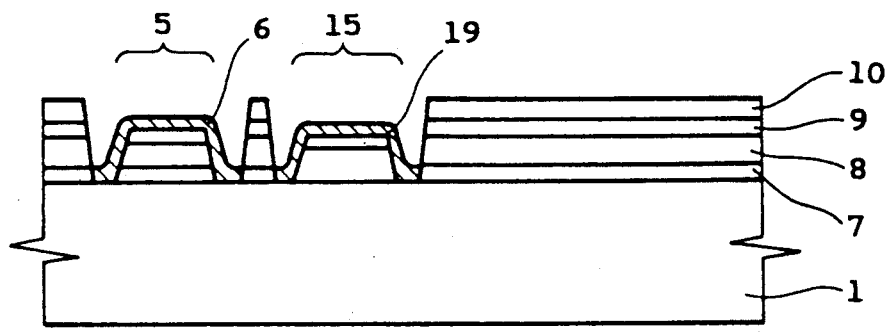
Figure 2H:
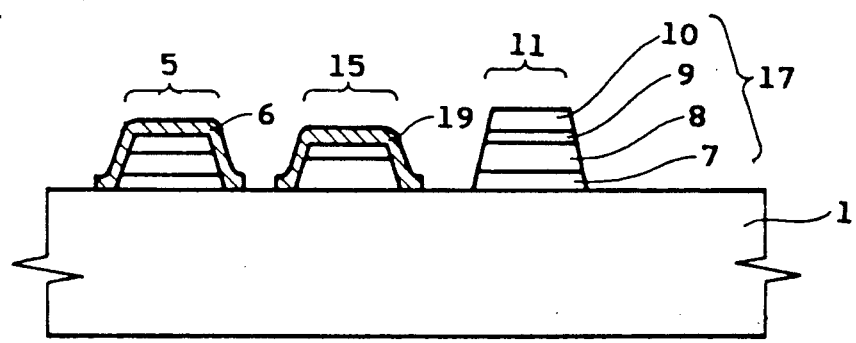

Selective epitaxial growth for an HBT is then performed. An n+-type GaInAs layer 7, an n-type GaInAs layer 8, a p-type GaInAs layer 9, and an n-type InP layer 10 are formed on the entire surface except for the selective growth masks 6 and 19 (FIG. 2G). Mesa etching is performed to leave an HEMT crystal 17 in an HBT region 11 as in the HEMT region 15 (FIG. 2H).

Figure 2I:
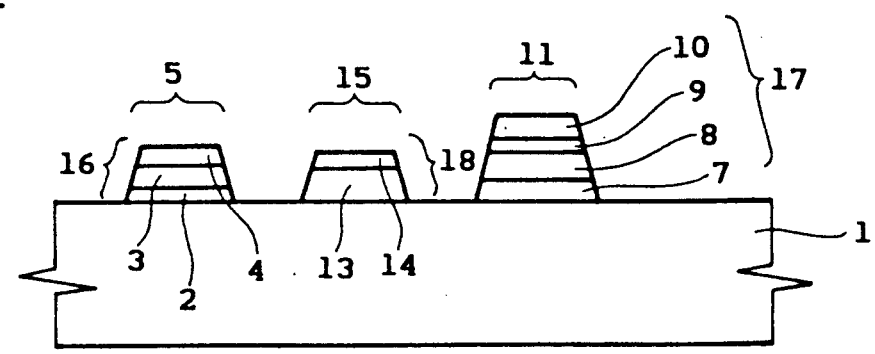

Finally, the selective growth masks 6 and 19 are removed to form the PIN-PD crystal 16, the HBT crystal 17, and the HEMT crystal 18 respectively in the regions 5, 11, and 15. (FIG. 2I). The respective epitaxial layers of the crystals 16, 17 and 18 are selectively etched to form the PIN-PD, HBT and HEMT device and thereafter electrodes 22 to 29 are, as shown in FIG. 1 formed to finish the semiconductor integrated circuit.

A p-type base layer (i.e., the p-type GaInAs layer 9 in the first embodiment) of the HBT is generally doped with an impurity at a concentration of $10^{18}$ cm$^{-3}$ or more. The impurity used as a p-type dopant such as zinc (Zn) and berrylium (Be) can be easily diffused at a high temperature. When the p-type dopant of the HBT is diffused in the n-type emitter (i.e., the n-type InP layer 10 in this embodiment), a p-n junction, i.e., an emitter-base junction is formed in the emitter. High emitter injection efficiency by a heterojunction may be disadvantageously lost.

When the p-type dopant is diffused in the collector (i.e., the n-type GaInAs layer 8 in this embodiment) is diffused, the thickness of the base layer is substantially increased, and the carrier travel time in the base layer may be prolonged, thereby often degrading the high-frequency characteristics (i.e., a decrease in cutoff frequency $f_T$).

According to the method of the first embodiment, the HBT crystal 17 is formed after formation of the PIN-PD crystal 16 and the HEMT crystal 18. In other words, no epitaxial growth for other elements is performed after formation of the HBT crystal 17. Therefore, the HBT crystal 17 is not exposed to high temperatures.

The p-type dopant is not diffused from the base layer to the emitter and collector layers, and the high-frequency characteristics are not degraded.

According to the method of manufacturing the semiconductor integrated circuit according to the first embodiment, the HBT crystal does not receive heat generated in epitaxial growth for forming other element crystals. The dopant in the base layer is not diffused into the emitter and collector layers. Therefore, the HBT can be monolithically formed together with the PIN-PD and the HEMT on a single substrate without degrading high emitter injection efficiency and high-frequency characteristics of the HBT.

Another method of manufacturing the semiconductor integrated circuit device shown in FIG. 1 according to the second embodiment will be described with reference to FIGS. 3A to 3I. An order of formation of epitaxial crystals 16 to 18 for PIN-PD, HBT, and HEMT is different from that in the first emodiment. More specifically, the HEMT epitaxial crystal 18, the PIN-PD epitaxial crystal 16, and the HBT epitaxial crystal 17 are formed in the order named.

The steps in manufacturing the semiconductor integrated circuit device of FIG. 1 according to the second embodiment will be described in detail with reference to FIGS. 3A to 3I.

Figure 3A:
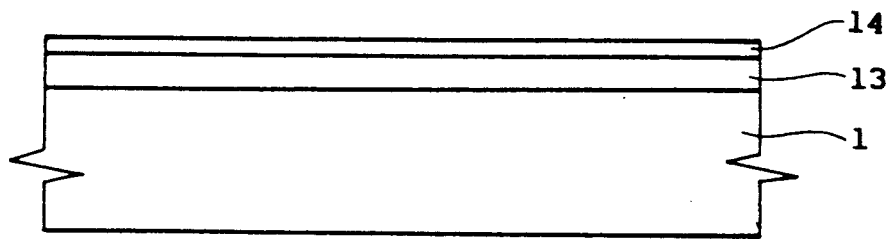
FIGS. 3A to 3I are sectional views for explaining the steps in manufacturing a semiconductor integrated circuit device according to a method of the second embodiment of the present invention.
Figure 3B:
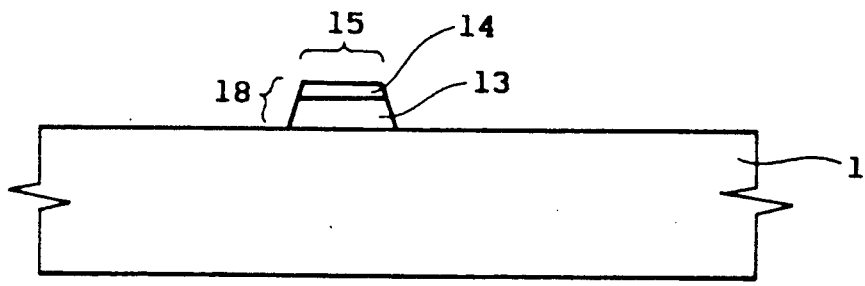
Figure 3C:
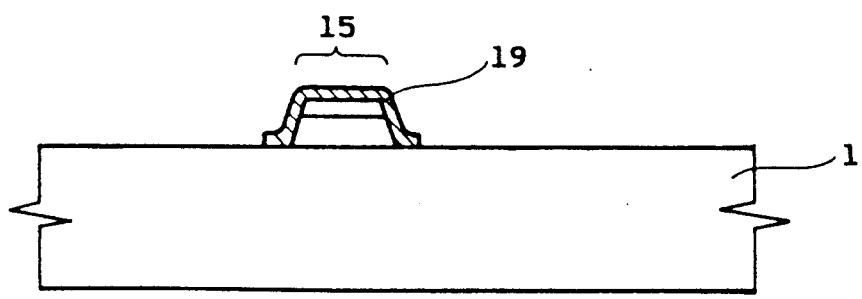

Epitaxial growth for forming an HEMT 18 is performed on a prepared InP susbstrate 1. An i-type GaInAs layer 13 serving as an active layer and an n-type AlInAs layer 14 serving as an electron donor layer are sequentially formed on the substrate 1 (FIG. 3A). Mesa etching is performed to leave the epitaxial layers 13 and 14 only in a prospective HEMT region 15. More specifically, a silicon nitride film is formed on the entire surface of the substrate by electron cyclotron resonance plasma chemical vapor deposition (ECR plasma CVD). A resist pattern is formed on the surface of the prospective HEMT region 15, and the silicon nitride film is etched with hydrofluoric acid (HF) by using the resist pattern as a mask. The epitaxial layers 13 and 14 are sequentially etched using the residual silicon nitride film and the resist pattern left on the prospective HEMT region 15 as masks. The resist pattern and the residual silicon nitride film used as the masks are removed to form an HEMT crystal 18 (FIG. 3). A selective mask 19 made of a silicon nitride or oxide film is formed in the HEMT region 15. This selective growth mask 19 is formed by the growth by means of ECR plasma CVD and patterning using a resist pattern as in the silicon nitride mask in the above mesa etching (FIG. 3C).

Figure 3D:
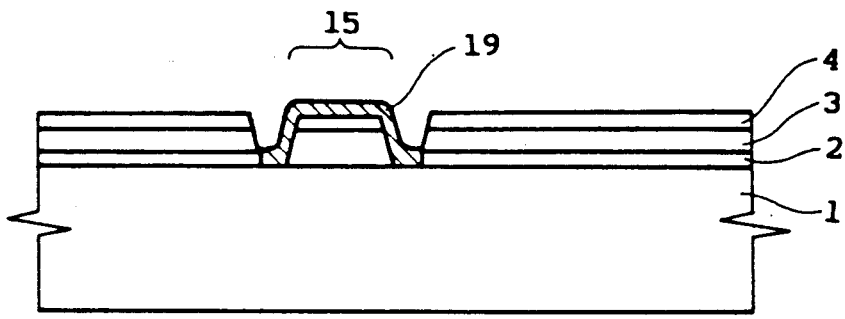
Figure 3E:
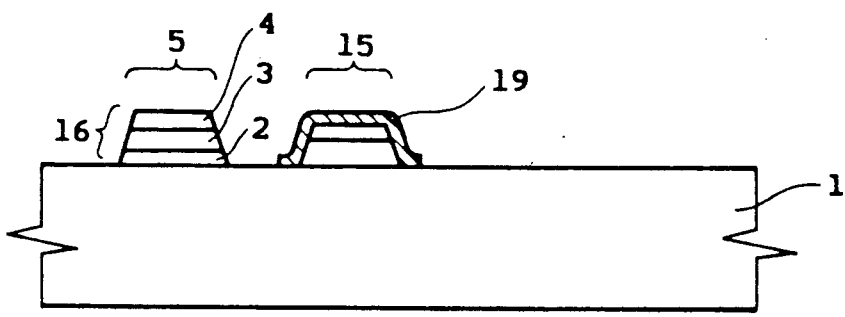
Figure 3F:
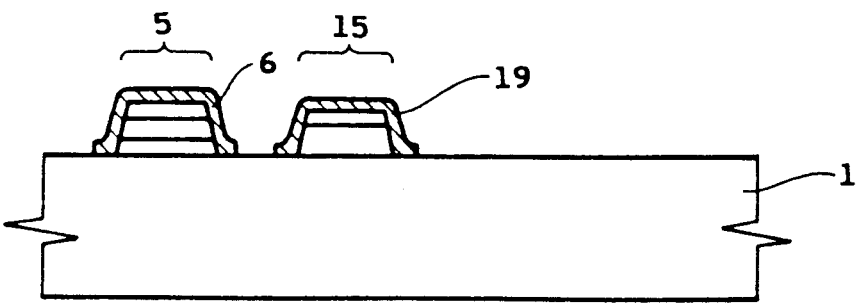

Selective epitaxial growth for a PIN-PD is performed. More specifically, an n-type GaInAs layer 2, an i-type GaInAs layer 3, and a p-type GaInAs layer 4 are sequentially formed except for a selective growth mask 19 (FIG. 3D). Mesa etching is performed to leave the epitaxial layers 2 and 4 in only a prospective PIN-PD region 5, thereby forming a PIN-PD crystal 16 (FIG. 3E). This mesa etching method is the same as that for the HEMT 18 and includes the step of forming a silicon nitride or oxide film by ECR plasma CVD, the step of patterning the silicon nitride or oxide film, and the etching step using the patterned film as a mask. A selective growth mask 6 consisting of a silicon nitride or oxide film is formed in the PIN-PD region 5. In this case, the selective growth mask 19 is left in the HEMT region 15. The selective growth mask 6 is formed by film formation by means of ECR plasma CVD and patterning using a resist pattern as in the selective growth mask 19 (FIG. 3F).

Figure 3G:
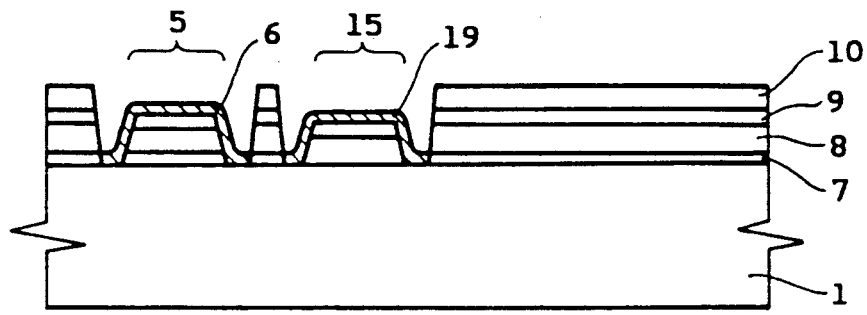
Figure 3H:
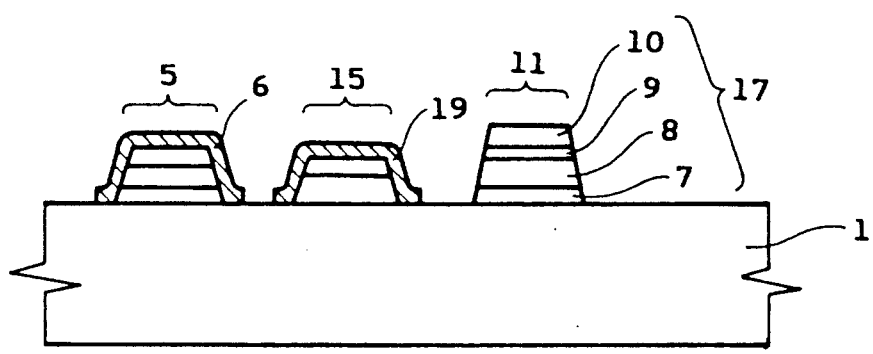

Selective epitaxial growth for an HBT is then performed. More specifically, an n+-type GaInAs layer 7, an n-type GaInAs layer 8, a p-type GaInAs layer 9, and an n-type InP layer 10 are sequentially formed on the entire surface except for the selective growth masks 6 and 19 (FIG. 3G). Mesa etching is performed to leave an HBT crystal 17 in an HBT region 11 in the same manner as in the PIN-PD region 5 (FIG. 3H).

Figure 3I:
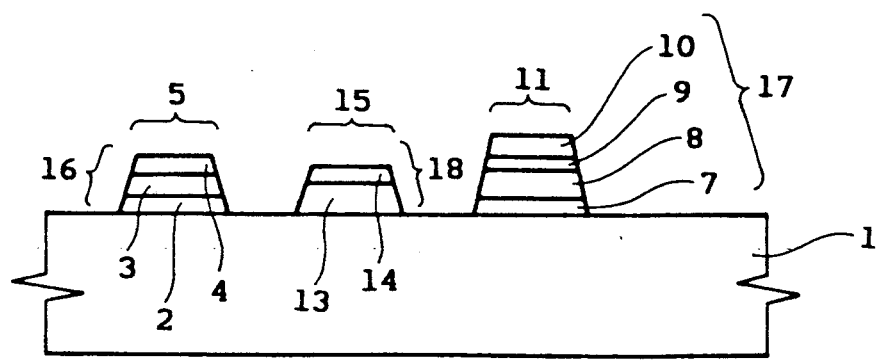

Finally, the selective growth masks 6 and 19 are removed to form the PIN-PD crystal 16, the HBT crystal 17, and the HEMT crystal 18 in the regions 5, 11, and 15 (FIG. 3I). The respective epitaxial layers of the crystals 16, 17 and 18 are selectively etched to form the PIN-PD, HBT and HEMT device and thereafter the electrodes 22 to 29 are, as shown in FIG. 1, formed to finish the semiconductor integrated circuit.

When epitaxial growth is performed on the entire surface of the substrate, the surface is etched by an appropriate etchant (e.g., sulfuric acid for an InP substrate) to expose a clean surface, and then crystal growth is performed. For this reason, a good epitaxial layer having a concentration of $1 \times 10^{15}$ cm$^{-3}$ or less can be obtained. To the contrary, when selective growth is performed, a selective growth mask consisting of silicon nitride or oxide is already formed on the surface of the substrate. For this reason, the selective growth mask becomes a contamination source, and it is not easy to set an impurity concentration of $1 \times 10^{16}$ cm$^{-3}$ or less.

In an HEMT having an n-type AlInAs/GaInAs epitaxial layer, when the impurity concentration in the GaInAs layer exceeds $1 \times 10^{16}$ cm$^{-3}$, a current tends to flow in not only the secondary electronlayer but also the GaInAs layer. There is a fear of an increase in drain conductance in the drain I-V characteristics and degradation of pinch-off characteristics. As compared with this degradation, an influence of the selective growth mask on other elements, i.e., the HBT and the PIN-PD is smaller than that on the HEMT.

In the second embodiment, epitaxial growth of the HEMT crystal is performed prior to epitaxial growth of the HBT and PIN-PD crystals. That is, the HEMT crystal is formed on a clean substrate on which a selective growth mask is not formed. Therefore, the impurity concentration in the GaInAs layer can be decreased to a sufficiently low level, an good drain I-V characteristics can be obtained.

In the second embodiment, after the HEMT crystal 18 is formed, the PIN-PD crystal 16 and the HBT crystal 17 are formed in the order named. However, if the HEMT crystal 18 is formed prior to other element crystals, the formation order of the PIN-PD crystal 16 and the HBT crystal 17 may be reversed.

According to the method of manufacturing the semiconductor integrated circuit of the second embodiment, the HEMT, the HBT, and the PIN-PD having different epitaxial structure are monolithically formed. In addition, since epitaxial growth for the HEMT crystal is performed on a clean substrate on which a selective growth mask is not formed, the impurity concentration of the active layer of the HEMT crystal can be reduced to a low level. Therefore, a semiconductor integrated circuit comprising an HEMT having a low drain conductance and good pinch-off characteristics can be obtained.

A still another method of manufacturing the semiconductor integrated circuit device shown in FIG. 1 according to the third embodiment will be described in detail with reference to FIGS. 4A to 4I. A formation order of a PIN-PD, an HBT, and an HEMT is different from those of the first and second embodiments. That is, a PIN-PD epitaxial crystal 16, and HBT epitaxial crystal 17, and an HEMT epitaxial crystal 18 are formed in the order named.

The steps in manufacturing the semiconductor integrated circuit device according to the third embodiment will be described with reference to FIGS. 4A to 4I.

Figure 4A:
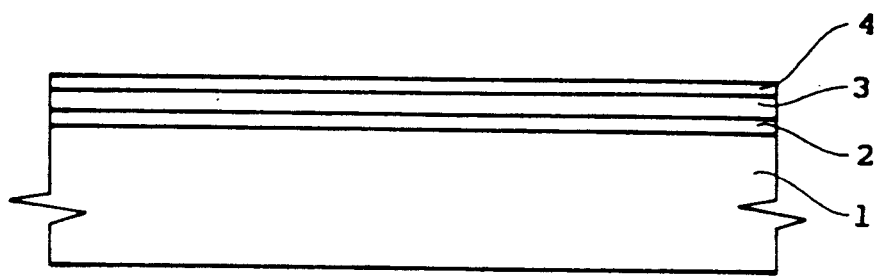
FIGS. 4A to 4I are sectional views for explaining the steps in manufacturing a semiconductor integrated circuit device according to a method of the third embodiment of the present invention.

Epitaxial growth for forming a PIN-PD is performed on a prepared InP substrate 1. More specifically, an n-type GaInAs layer 2, an i-type GaInAs layer 3, and a p-type GaInAs layer 4 are sequentially formed on the InP substrate 1 (FIG. 4A).

Figure 4B:
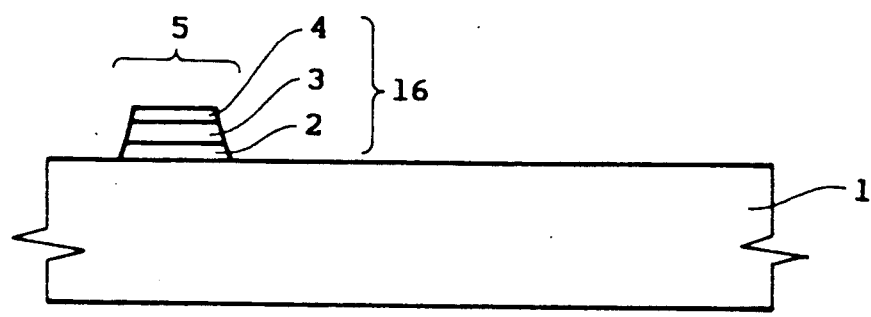

Mesa etching is performed to leave the epitaxial layers 2 and 3 in only a prospective PIN-PD region 5. A silicon nitride film is formed on the entire surface of the substrate by, e.g., electron cyclotron resonance plasma chemical vapor deposition (ECR plasma CVD). A resist pattern is formed on the surface of the PIN-PD region 5, and the silicon nitride film is etched with hydrofluoric acid (HF) by using this resist pattern as a mask. The epitaxial layers 2 and 4 are sequentially etched using the residual silicon nitride film and the resist pattern left in the PIN-PD region 5 as masks. The resist pattern and the residual silicon nitride film used as the mask are removed to form a PIN-PD crystal 16 (FIG. 4B).

Figure 4C:
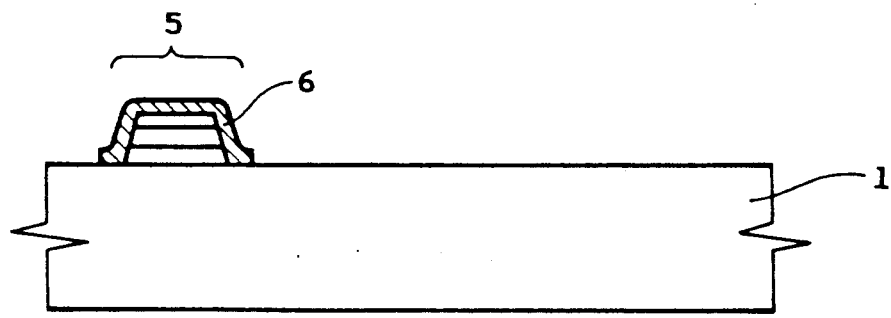

A selective growth mask 6 consisting of a silicon nitride or oxide film is formed in the PIN-PD region 5. This selective growth mask 6 is formed by growth by means of ECR plasma CVD and patterning using a resist pattern (FIG. 4C).

Figure 4D:
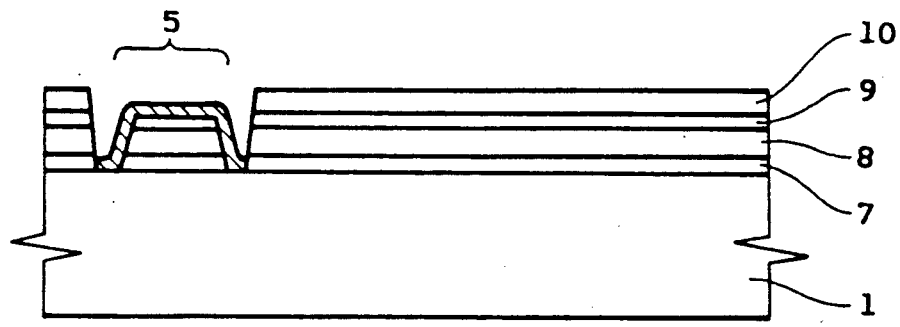
Figure 4E:
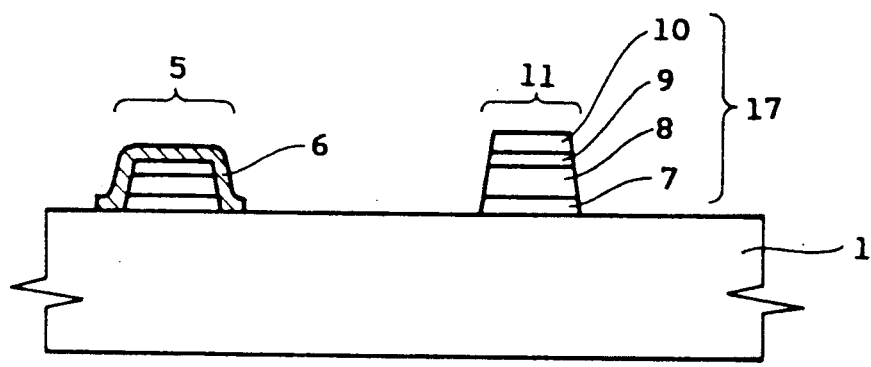
Figure 4F:
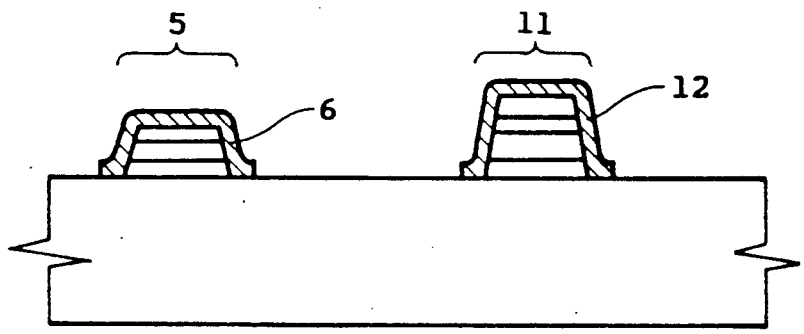
Figure 4G:
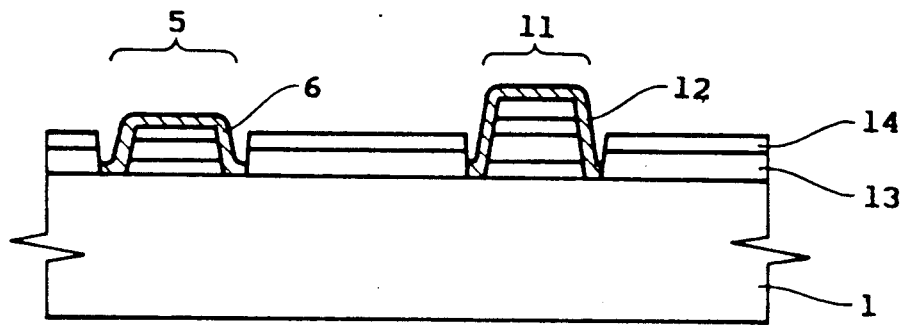

Selective epitaxial growth for an HBT is performed. More specifically, an n+-type GaInAs layer 7, an n-type GaInAs layer 8, a p-type GaInAs layer 9, and an n-type InP layer 10 are sequentially formed on the entire surface except for the selective growth mask 6 (FIG. 4D). Mesa etching is performed to leave the epitaxial layers 7 to 10 on a prospective HBT region 11, thereby forming an HBT crystal 17 (FIG. 4E). This mesa etching method is the same as that for the PIN-PD region 5 and includes the step of forming a silicon nitride or oxide film by ECR plasma CVD, the step of patterning the silicon nitride or oxide film, and the etching step using the pattern film as a mask. A selective growth mask 12 consisting of a silicon nitride or oxide film is formed in HBT region 11. In this case, the selective growth mask 6 is left in the PIN-PD region 5. The selective growth mask 12 is formed by film formation by means of ECR plasma CVD and patterning using a resist pattern as in the selective growth mask 6 (FIG. 4F).

Figure 4H:
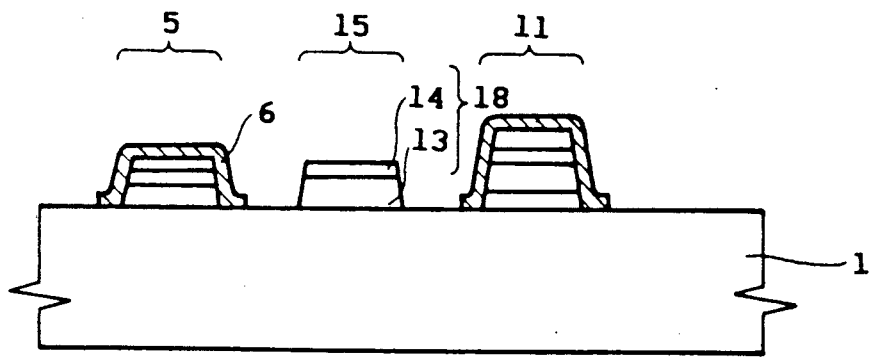

Selective epitaxial growth for an HEMT is performed. More specifically, an i-type GaInAs layer 13 serving as an active layer and an n-type AlInAs layer 14 serving an electron donor layer are sequentially formed on the entire surface except for the selective growth masks 6 and 12 (FIG. 4C). Mesa etching is performed to leave the HEMT crystal 18 in an HEMT region 15 as in the HBT region 11 (FIG. 4H).

Figure 4I:
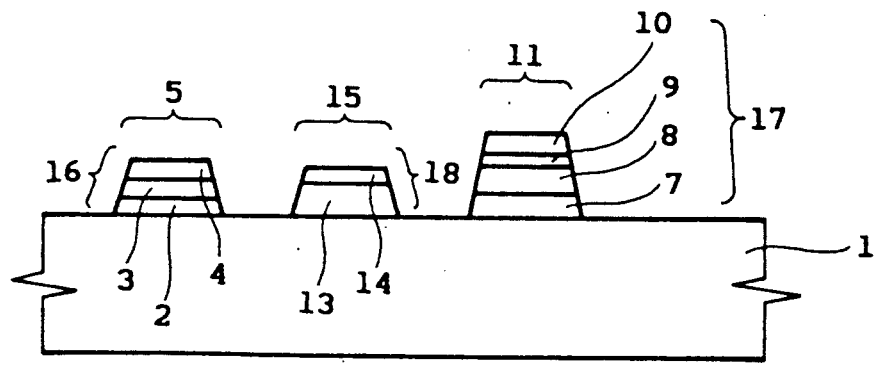

Finally, the selective growth masks 6 and 12 are removed to form the PIN-PD crystal 16, the HBT crystal 17, and the HEMT crystal 18 respectively in the regions 5, 11, and 15 (FIG. 4I). The respective epitaxial layers of the crystals 16, 17 and 18 are selectively etched to form the PIN-PD, HBT and HEMT device and thereafter the electrodes 22 to 29 are, as shown in FIG. 1, formed to finish the semiconductor integrated circuit.

The electrodes formed on the surface of the HBT crystal 17 and the surface of the PIN-PD crystal 16 are ohmic contacts. More specifically, an emitter electrode is formed on the surface of the n-type InP layer 10 as the uppermost layer of the HBT crystal 17, and an electrode serving as an anode is formed on the p-type GaInAs layer 4 as the uppermost layer of the PIN-PD crystal 16. In addition to the source and drain electrodes as ohmic contact electrodes, a Schottky gate electrode is formed on the n-type AlInAs layer 14 as the uppermost layer of the HEMT crystal 18. The characteristics of the Schottky gate electrode are very sensitive to crystallinity of the crystal surface. That is, when quality of the crystal surface is poor, a reverse current (i.e., a gate leakage current) may be increased, and shot noise of the semiconductor integrated circuit may be increased.

When a silicon nitride or oxide film serving as a selective growth mask is formed, crystal defects are formed in this film. When selective growth of an epitaxial layer is performed in a state wherein a selective growth mask is formed, crystal defects are formed due to a difference between thermal expansion coefficients of the silicon nitride or oxide film and the epitaxial layer during heating or cooling. The silicon nitride or oxide film may react with the epitaxial layer by heat during the growth to cause diffusion of atoms. In this manner, the selective growth mask may degrade the crystal quality of the surface on which it is formed.

In the method according to the third embodiment, since the HEMT crystal 18 is formed after the PIN-PD crystal 16 and the HBT crystal 17 are formed, the selective growth mask is not formed on the HEMT crystal 18 which causes surface quality to adversely affect element characteristics. Degradation of crystal quality caused by a selective growth mask does not occur on the surface of the HEMT crystal. Therefore, the gate leakage current of the Schottky gate electrode can be minimized.

According to the method of manufacturing the semiconductor integrated circuit of the third embodiment, since no selective growth mask is formed on the HEMT crystal, the surface crystal state can be kept excellent. Therefore, a reverse current of the Schottky gate electrode formed on the surface crystal can be minimized, and a semiconductor integrated circuit having good noise characteristic can be obtained.

Figure 5A:
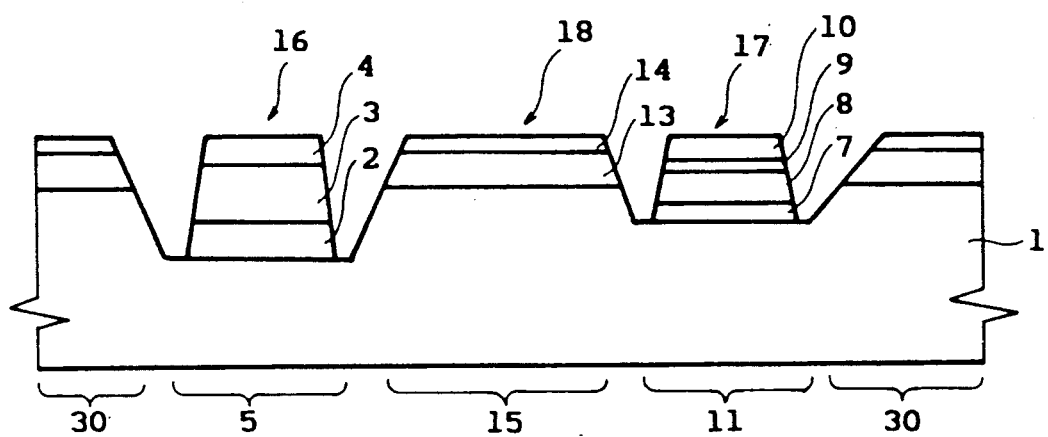
FIGS. 5A to 5D are sectional views for explaining the steps in manufacturing a semiconductor integrated circuit device according to a method of the fourth embodiment of the present invention.

A method of manufacturing a semiconductor integrated circuit device according to the fourth embodiment of the present invention will be described with reference to FIGS. 5A to 5D. According to the fourth embodiment, as shown in FIG. 5A, epitaxial crystal layers constituting an HEMT epitaxial crystal are formed on an indium phosphide (InP) semiconductor substrate 1, and then a PIN-PD region 5 and an HBT region 11 are selectively etched. A PIN-PD epitaxial crystal 16 and an HBT crystal 17 are formed in the regions 5 and 11, respectively. An HEMT epitaxial crystal 18 is formed in an HEMT region 15.

The HEMT crystal 18 consists of a GaInAs layer 13 serving as an active layer and an n-type AlInAs layer 14 serving as an electron donor layer. The PIN-PD crystal 16 consists of an n-type InP layer 2 serving as an n-type layer, an i-type GaInAs layer 3 serving as an i-type layer, and a p-type InP layer 4 serving as a p-type layer. The HBT crystal 17 consists of an n-type InP layer 7 serving as a subcollector layer, an n-type GaInAs layer 8 serving as a collector layer, a p-type GaInAs layer 9 serving as a base layer, and an n-type InP layer 10 serving as an emitter layer. At the time of formation of the HEMT crystal 18, the GaInAs layer and the n-type AlInAs layer which constitute the HEMT crystal are also formed in an HEMT unnecessary region 30.

A technique for forming the above epitaxial crystals is the same as those described with reference to the first to third embodiments. That is, a conventional epitaxial growth technique and a conventional selective growth technique can be used. In the fourth embodiment, the HEMT epitaxial crystal is formed first. However, the PIN-PD or HBT epitaxial crystal layer may be formed first.

Figure 5B:
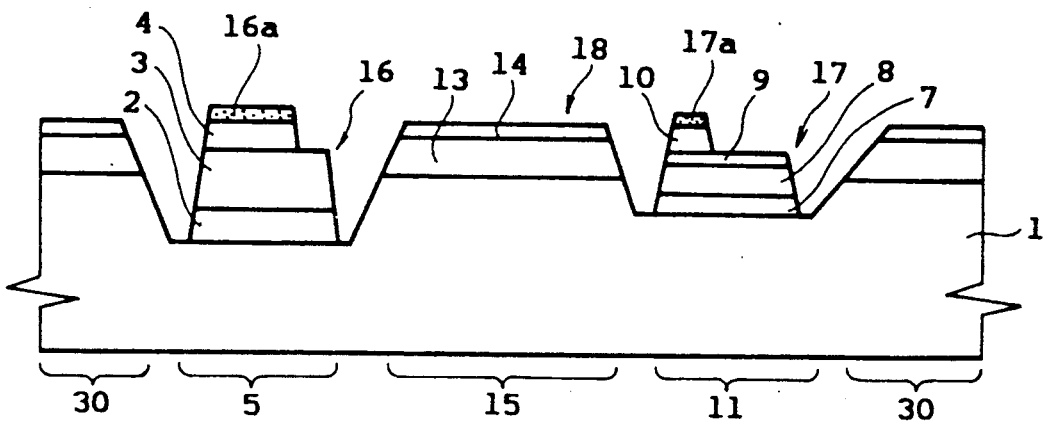

A resist is applied to the substrate, the entire surface of which is deposited with a silicon nitride film. The resist is patterned using a photolithographic technique. The silicon nitride film is then patterned using the resist pattern as a mask, thereby forming etching masks 16a and 17a consisting of the patterned silicon nitride and resist films, respectively. The masks 16a and 17a may consists of silicon oxide in place of silicon nitride. The p-type layer 4 of the PIN-PD crystal 16 and the emitter layer 10 of the HBT crystal 17 are etched while parts of them are shielded by the masks 16a and 17a (FIG. 5B).

At this time, an etchant such as HCl:H$_3$PO$_4$ having selectivity for etching InP but not etching GaInAs and AlInAs is used. That is, selective etching is performed, so that etching of the p-type layer 4 and the emitter layer 10 is automatically stopped.

Figure 5C:
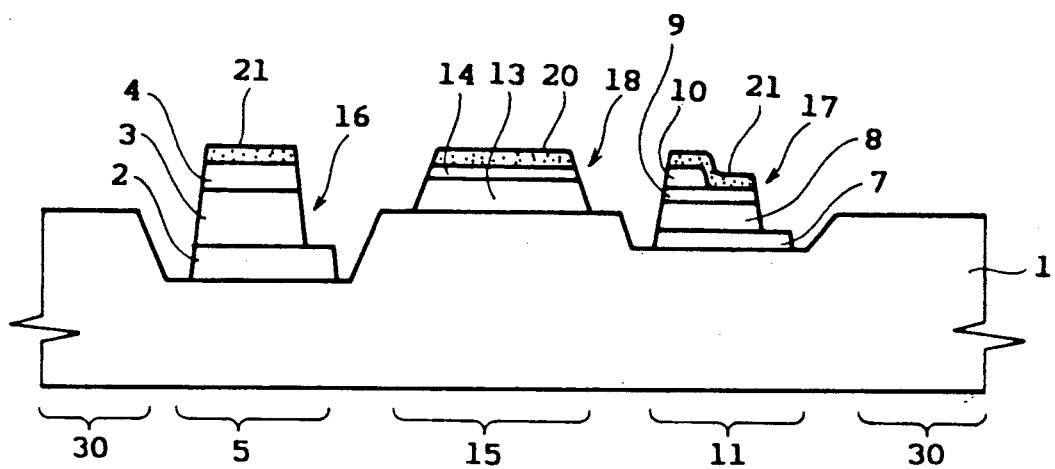
Figure 5D:
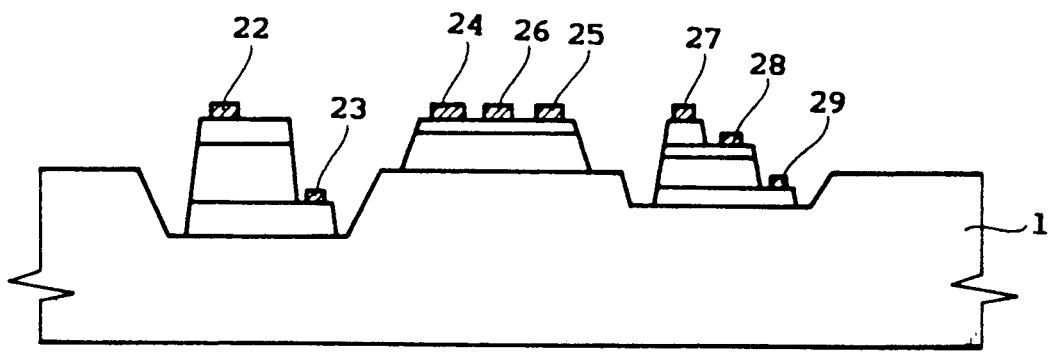

Masks 20 and 21 each consisting of a silicon nitride pattern (or a silicon oxide pattern) and a resist pattern are formed in predetermined portions of the HEMT region 15 and the HBT region 11, respectively. Etching is performed by shielding predetermined portion with the masks 16a, 20, and 21 thereby selectively removing the i-type layer 3 of the PIN-PD crystal 16, the base layer 8 of the HBT crystal 17, and the electron donor layer 14 and the active layer 13 of the HEMT crystal 18 (including the HEMT unnecessary region) (FIG. 5C).

At this time, an etchant such as H$_2$SO$_4$:H$_2$O$_2$ having selectivity for etching GaInAs and AlInAs but not etching InP is used. That is, selective etching is performed, so that etching of the i-type layer 3, the base layer 8, the collector layer 9, the electron donor layer 14, and the active layer 13 is automatically stopped. If the subcollector layer 7 of the HBT crystal 17 and the n-type layer 2 of the PIN-PD crystal 16 do not consist of InP but GaInAs, the above etching operation must be stopped when either of the layers 7 and 2 is exposed. Since the thickness of the i-type layer of the PIN-PD crystal is generally 2 μm or more, and a total thickness of the base and collector layers of the HBT crystal is generally 1 μm or less, a time required for exposing the n-type layer of the PIN-PD crystal is different from that required for exposing the subcollector layer of the HBT crystal. The n-type layer of the PIN-PD crystal and the subcollector layer of the HBT crystal cannot, therefore, be simultaneously exposed. More specifically, in the fourth embodiment, since the n-type layer of the PIN-PD crystal and the subcollector layer of the HBT crystal consist of InP and the electron donor and active layers of the HBT crystal respectively consist of n-type AlInAs and GaInAs, so-called selective etching can be performed. The i-type layer 3 of the PIN-PD crystal 16, the base layer 8 of the HBT crystal, and HEMT crystal portions corresponding to the collector layer 9 and the unnecessary region 30 can be selectively and simultaneously etched.

After the etching process described above is completed, a p- and n-type electrodes 22 and 23 of the PIN-PD crystal, source, drain, and gate electrodes 24, 25, and 26 of the HEMT crystal, and emitter, base, and collector electrodes 27, 28, and 29 of the HBT crystal are formed (FIG. 5D), and necessary wiring is performed to finish a desired semiconductor integrated circuit.

FIGS. 6A to 6D are sectional views showing the steps in manufacturing a semiconductor integrated circuit according to the fifth embodiment. The semiconductor integrated circuit obtained by the method of the fifth embodiment is substantially the same as that by the method of the forth embodiment except that a p-type layer of a PIN-PD crystal does not consist of InP but GaInAs. The same reference numerals as in the fourth embodiment denote the same parts in the fifth embodiment, and a detailed description thereof will be omitted.

Figure 6A:
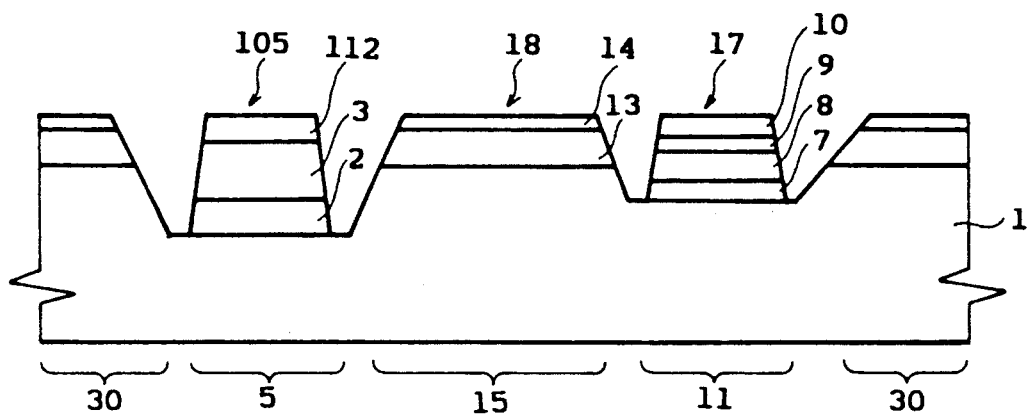
FIGS. 6A to 6D are sectional views for explaining the steps in manufacturing a semiconductor integrated circuit device according to a method of the fifth embodiment of the present invention.
Figure 6B:
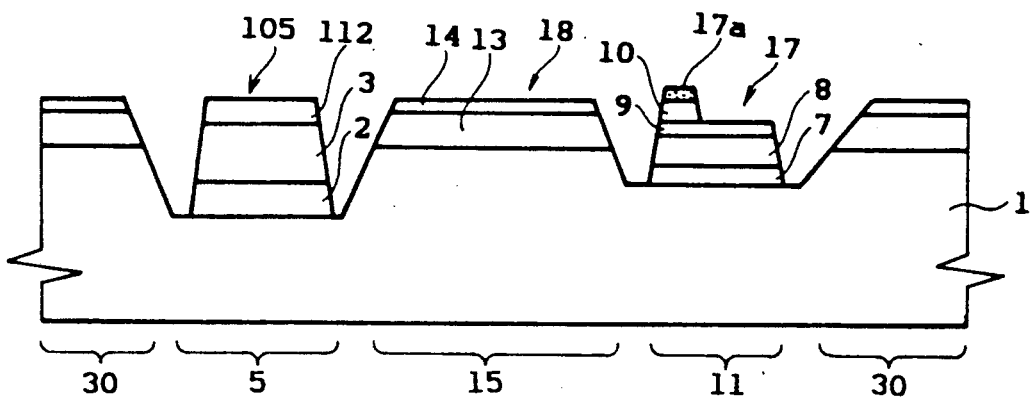

A PIN-PD crystal 105, an HEMT crystal 18, and an HBT crystal 17 are formed on an InP substrate 1 (FIG. 6A), and a mask 17a including a resist film and a silicon nitride film is formed on an emitter layer 10 of the HBT crystal 17. Selective etching is performed while a predetermined portion is shielded by the mask 17a, thereby exposing a base layer 8 of the HBT crystal 17 (FIG. 6B).

Figure 6C:
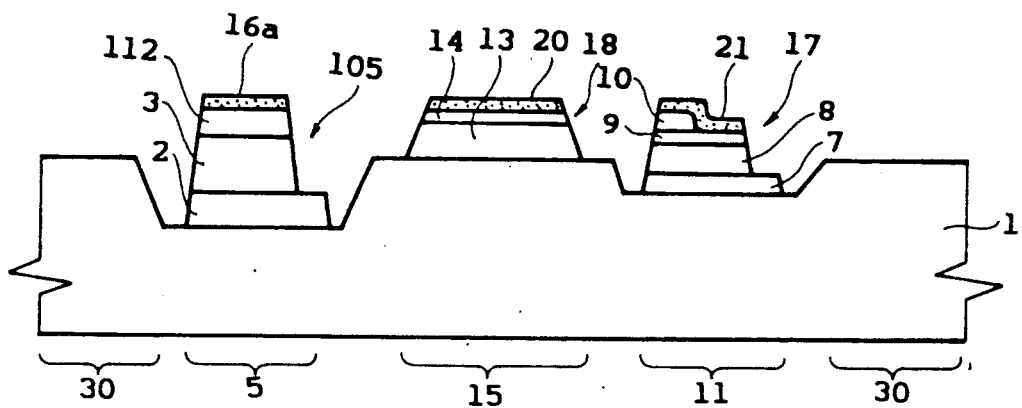
Figure 6D:
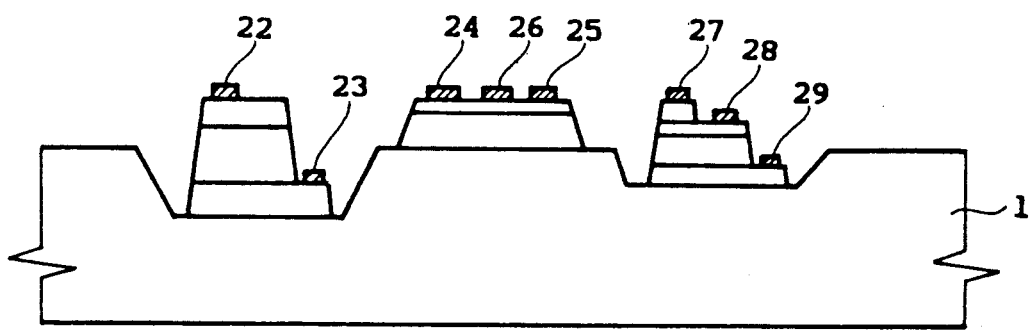

Masks 16a, 20, and 21 each including a resist film and a silicon nitride film are formed, and selective etching is performed while a desired portion is shielded by these masks. An i-type layer 3 of the PIN-PD crystal 105, the base layer 8 of the HBT crystal, and the HEMT crystal portion in an unnecessary region 30 are selectively etched (FIG. 6C). Electrodes 22 to 29 are formed (FIG. 6D), and finally wiring is performed to finish a desired semiconductor integrated circuit.

According to each of the methods of manufacturing the integrated circuits of the fourth and fifth embodiments, the i-type layer (both the p- and i-type layers if the p-type layer consists of GaInAs) of the PIN-PD crystal, the base and collector layers of the HBT crystal, and the HEMT crystal portion of the unnecessary region can be simultaneously etched without strictly controlling the etching time. Therefore, a semiconductor integrated circuit including PIN-PDs, HEMTs, and HBTs can be manufactured within a short period of time.

Note that the materials for a substrate and epitaxial growth layer are not limited to the particular embodiments described above, but can be arbitrarily selected.

Figure 7A:
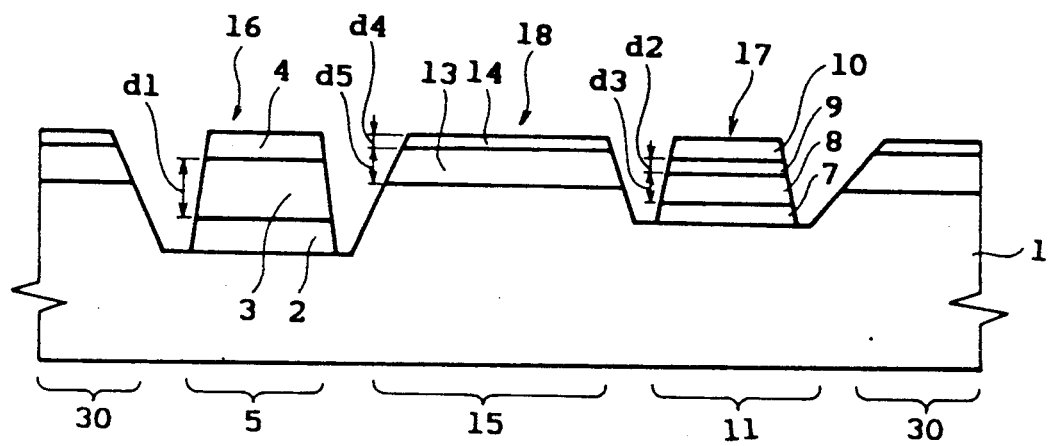
FIGS. 7A to 7D are sectional views for explaining the steps in manufacturing a semiconductor integrated circuit device according to a method of the sixth embodiment of the present invention.
Figure 7B:
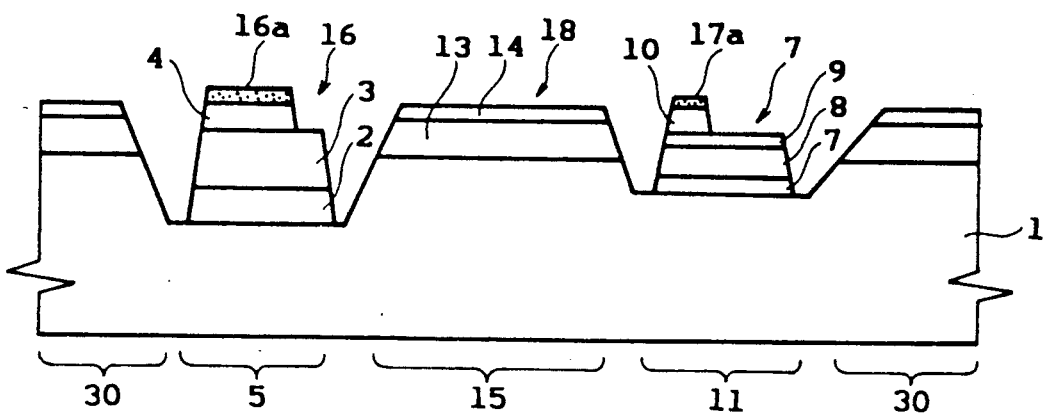
Figure 7C:
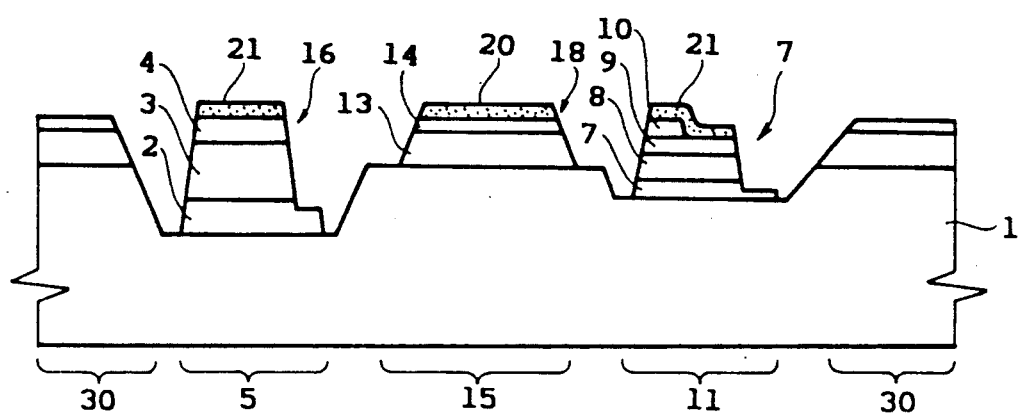
Figure 7D:
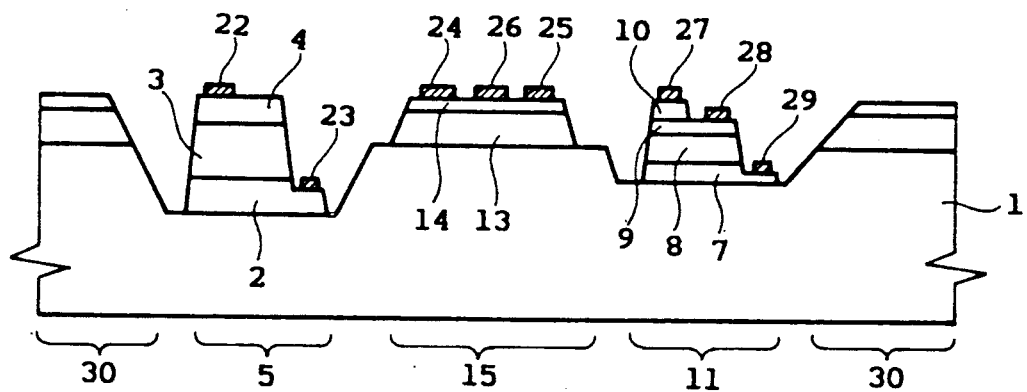

A method of manufacturing a semiconductor integrated circuit device according to the sixth embodiment of the present invention will be described with reference to FIGS. 7A to 7D. Following the same procedures as in the fourth embodiment, a PIN-PD epitaxial crystal 16, an HEMT epitaxial crystal 18, and an HBT epitaxial crystal 17 are respectively formed in a PIN-PD region 5, and HEMT region 15, and an HBT region 11 on an indium phosphide (InP) semiconductor substrate 1 in the sixth embodiment, as shown in FIG. 7A. The thicknesses of the epitaxial crystals formed in these regions satisfy the following inequalities:

$$0.9d_1 < d_2 + d_3 < 1.1d_1 \quad (1)$$

$$d_4 + d_5 < d_1 \quad (2)$$

Where $d_1$ is the thickness of an i-type layer 3 of the PIN-PD crystal 16, $d_2$ is the thickness of a base layer 8 of the HBT crystal 17, $d_3$ is the thickness of a collector layer 9 of the HBT crystal 17, $d_4$ is the thickness of an electron donor layer 14 of the HEMT crystal 18, and $d_5$ is the thickness of an active layer 13 of the HEMT crystal 18. Inequality (1) indicates that epitaxial growth is performed such that a total thickness of the base layer 8 and the collector layer 9 is set to be almost equal to the thickness of the i-type layer 3. Inequality (2) indicates that a total thickness of the electron donor layer 14 and the active layer 13 is set to be smaller than the thickness of the i-type layer 3.

Following the same procedures as in the fourth embodiment described with reference to FIG. 5B, a semiconductor integrated circuit device (FIG. 7A) having a sectional shape (FIG. 7B) is manufactured.

Following the same procedures as in the fourth embodiment described with reference to FIG. 5B, a semiconductor integrated circuit device (FIG. 7A) having a sectional shape (FIG. 7C) is manufactured. In this case, an etchant such as $H_2SO_4$:$H_2O_2$ is used both GaInAs and AlInAs. An etching time must be controlled in accordance with the thicknesses of the epitaxial layers and their etching rates. However, since the thicknesses of the epitaxial layers to be etched are determined to satisfy inequalities (1) and (2), an n-type layer 2 of the PIN-PD crystal 16 and a subcollector layer 7 of the HBT crystal 17 are almost simultaneously exposed. Upon exposure of the layers 2 and 7, the HEMT crystal portion of an unnecessary region 30 is perfectly removed.

After the etching process is completed, a p-type electrode 22 and an n-type electrode 23 of the PIN-PD crystal, a source electrode 24, a drain electrode 25, and a gate electrode 26 of the HEMT crystal, and an emitter electrode 27, a base electrode 28, and a collector electrode 29 of the HBT crystal are formed (FIG. 7D), and necessary wiring is performed to finish a desired integrated circuit.

FIGS. 8A to 8D are sectional views for explaining the steps in manufacturing a semiconductor integrated circuit device according to a method of the seventh embodiment of the present invention. This embodiment is substantially the same as the sixth embodiment except that a p-type layer of a PIN-PD crystal does not consist of InP but GaInAs. The same reference numerals as in FIGS. 7A to 7D denotes the same parts in FIGS. 8A to 8D, and a detailed description thereof will be omitted.

Figure 8A:
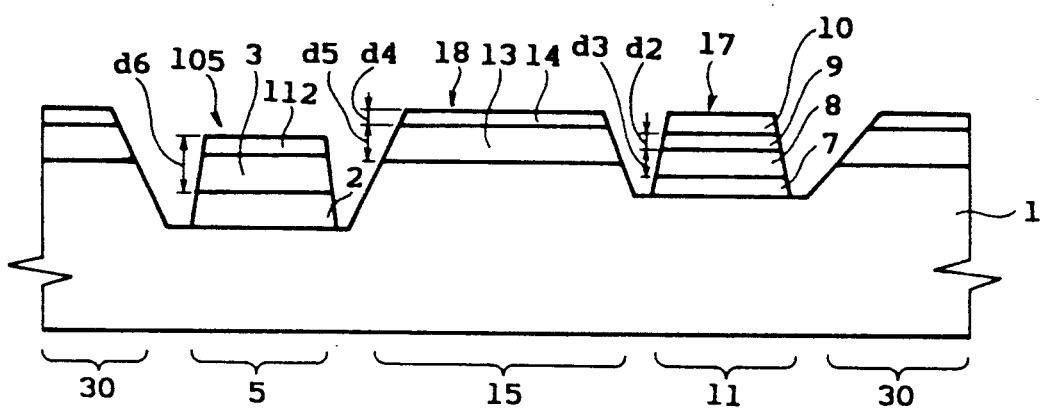
FIGS. 8A to 8D are sectional views for explaining the steps in manufacturing a semiconductor integrated circuit device according to a method of the seventh embodiment of the present invention.

A PIN-PD crystal 105, an HEMT crystal 18, and an HBT crystal 17 are formed on an InP substrate 1 (FIG. 8A). At this time, the thicknesses of epitaxial layers are determined to satisfy the following inequalities:

$$0.9d_6 < d_2 + d_3 < 1.1d_6 \quad (3)$$

$$d_4 + d_5 < d_6 \quad (4)$$

where $d_6$ is the total thickness of an i-type layer 3 and a p-type layer 112 of the PIN-PD crystal 105, $d_2$ is the thickness of a base layer 8 of the HBT crystal 17, $d_3$ is the thickness of a collector layer 9 of the HBT crystal 17, $d_4$ is the thickness of an electron donor layer 14 of the HEMT crystal 18, and $d_5$ is the thickness of an active layer 13 of the HEMT crystal 18.

The meanings of these inequalities are the same as those of inequalities (1) and (2) described above.

Figure 8B:
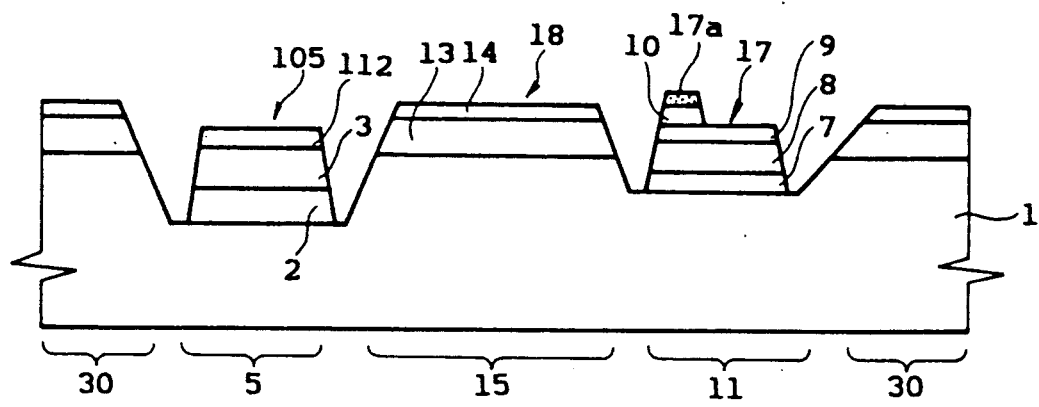

A mask 17a including a resist film and a silicon nitride film is formed on an emitter layer 10 of the HBT crystal 17, and selective etching is performed while a predetermined area is shielded with the mask 17a, thereby exposing the base layer 8 of the HBT crystal 17 (FIG. 8B).

Figure 8C:
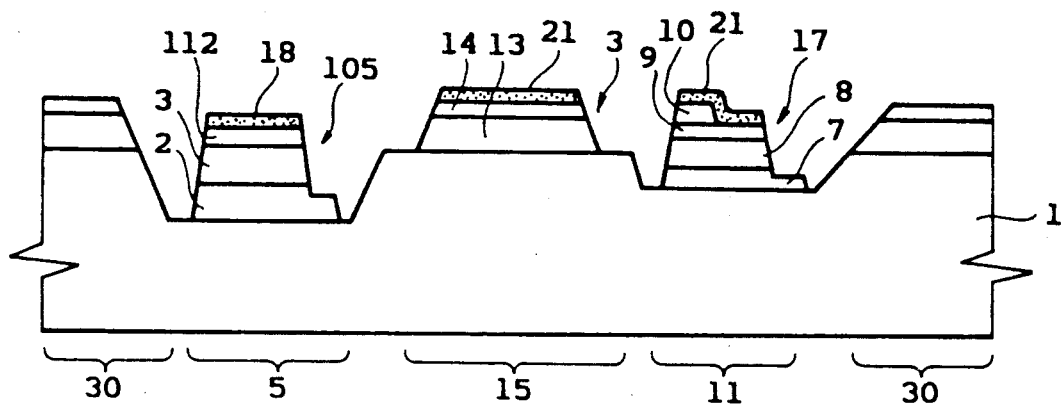
Figure 8D:
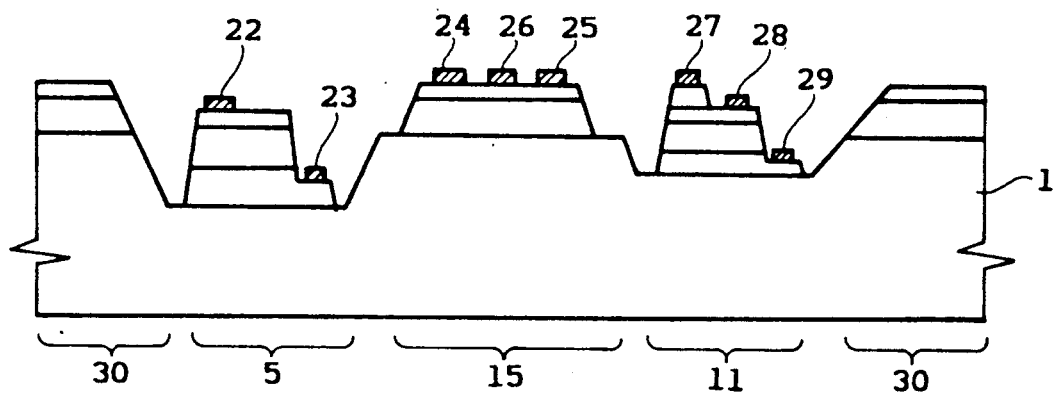

Masks 16a, 20 and 21 each including a resist film and a silicon nitride film are formed, and etching is performed while a desired area is shielded with these masks, thereby selectively etching the p- and i-type regions 112 and 3 of the PIN-PD crystal 105, the base and collector layers 8 and 9 of the HBT crystal 17, and an HEMT crystal portion of an unnecessary region 30 are simultaneously and selectively etched (FIG. 8C). Since the thicknesses of the respective epitaxial layers are determined to satisfy inequalities (3) and (4), the n-type layer 2 of the PIN-PD crystal 105 and the subcollector layer 7 of the HBT crystal 17 are almost simultaneously exposed. Upon exposure of these layers 2 and 7, the HEMT crystal portion corresponding to the unnecessary region 30 can be perfectly removed. Thereafter, necessary electrodes 22 to 29 are formed (FIG. 8D), and finally wiring is performed to finish a desired semiconductor integrated circuit.

According to the methods of the sixth and seventh embodiments, when the i-type layer (p- and i-type layers if the i-type layer of the PIN-PD crystal consists of GaInAs), the base and collector layers of the HBT crystal, and the electron donor and active layers of the HEMT crystal are set to satisfy the predetermined relations. When these layers are almost simultaneously etched, the n-type layer of the PIN-PD crystal is exposed almost simultaneously with the subcollector layer of the HBT crystal. At the same time, the HEMT crystal portion corresponding to the unnecessary region is prefectly removed. That is, exposure of the n-type layer of the PIN-PD crystal, exposure of the subcollector layer of the HBT crystal, and removal of the HBT crystal portion corresponding to the unnecessary region are achieved by one etching process. Therefore, a semiconductor integrated circuit including PIN-PDs, HEMTs, and HBTs can be manufactured within a short period of time.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A method of manufacturing a semiconductor integrated circuit, comprising:

the first step of growing a first epitaxial crystal on a compound semiconductor substrate, removing an unnecessary region of the first epitaxial crystal to form a residual portion, and covering the residual portion with a selective growth mask;

the second step of growing a second epitaxial crystal on an exposed substrate portion, removing an unnecessary portion of the second epitaxial crystal to form a residual portion of the second epitaxial crystal, and covering the residual portion of the second epitaxial crystal with a selective growth mask; and the third step of growing a third epitaxial crystal on an exposed substrate portion and removing an unnecessary region of the third epitaxial crystal, wherein the first to third epitaxial crystal form any one of a pin photodiode crystal, a heterojunction bipolar transistor crystal, and a high electron mobility transistor crystal, and are different from each other.

2. A method according to claim 1, wherein the third epitaxial crystal is the heterojunction bipolar transistor crystal.

3. A method according to claim 1, wherein the first epitaxial crystal is the high electron mobility transistor crystal.

4. A method according to claim 1, wherein the third epitaxial crystal is the high electron mobility transistor crystal.

5. A method of manufacturing a semiconductor integrated circuit comprising the steps of:

forming a pin photodiode crystal, an n- and p-type layers of which essentially consist of InP and an i-type layer of which essentially consists of GaInAs, a high electron mobility transistor crystal, an electron donor layer of which essentially consists of AlInAs and an active layer of which essentially consists of GaInAs, and a heterojunction bipolar transistor, a subcollector layer and an emitter layer of which essentially consists of InP and a collector layer and a base layer of which essentially consist of GaInAs, the pin photodiode, high electron mobility transistor, and heterojunction bipolar transistor crystals being formed on an InP semiconductor substrate in accordance with the methods defined in claim 1 partially and simultaneously etching the p-type and emitter layers to partially expose the i-type layer and the base layer;

partially and simultaneously etching the i-type layer, the base layer, the collector layer, the electron donor layer, and the active layer to partially expose the n-type layer and the subcollector layer and leave only a necessary region of the high electron mobility transistor crystal; and forming necessary electrodes respectively formed on the p- and n-type layers, on the emitter, base, and subcollector layers, and on the electron donor layer.

6. A method of manufacturing a semiconductor integrated circuit, comprising the steps of:

forming a pin photodiode crystal, an n-type layer of which essentially consists of InP and i- and p-type layers of which essentially consist of GaInAs, a high electron mobility transistor crystal, an electron donor layer of which essentially consists of AlInAs and an active layer of which essentially consists of GainAs, and a heterojunction bipolar transistor crystal, subcollector and emitter layers of which essentially consist of InP and collector and base layers of which essentially consist of GaInAs, the pin photodiode, high electron mobility transistor, and heterojunction bipolar transistor crystals being formed on an InP semiconductor substrate in accordance with the methods defined in claim 1 partially and simultaneously etching the emitter layer to partially expose the base layer;

partially and simultaneously etching the p-type layer, the i-type layer, the base layer, the collector layer, the electron donor layer, and the active layer to partially expose the n-type layer and the subcollector layer and to leave only necessary region of the high electron mobility transistor crystal; and forming necessary electrodes on the p- and n-type layers, on the emitter, base, and subcollector layers, and on the electron donor layer.

7. A method of manufacturing a semiconductor integrated circuit, comprising the steps of:

forming a pin photodiode crystal, a p-type layer of which essentially consists of InP and n- and i-type layers of which essentially consist of GaInAs, a high electron mobility transistor crystal, an electron donor layer of which essentially consists of AlInAs and an active layer of which essentially consists of GaInAs, and a heterojunction bipolar transistor crystal, an emitter layer of which essentially consists of InP, and subcollector, collector, and base layers of which essentially consist of GaInAs, the pin photodiode, high electron mobility transistor, and heterojunction bipolar transistor crystals being formed on an InP substrate according to the methods defined in claim 1 as to satisfy the following conditions:

$$0.9d_1 < d_2 + d_3 < 1.1d_1$$

$$d_4 + d_5 < d_1$$

where
$d_1$ is a thickness of the i-type layer
$d_2$ is a thickness of the base layer
$d_3$ is a thickness of the collector layer
$d_4$ is a thickness of the electron donor layer
$d_5$ is a thickness of the active layer partially and simultaneously etching the p-type and emitter layers to partially expose the i-type and base layers;

partially and simultaneously etching the i-type layers, the base layer, the collector layer, the electron donor layer, and the active layer to expose the n-type and subcollector layers and leave only a necessary region of the high electron mobility transistor; and forming necessary electrodes on the p- and n-type layers, on the emitter, base, and subcollector layers, and on the electron donor layer.

8. A method of manufacturing a semiconductor integrated circuit, comprising the steps of:

forming a pin photodiode crystal, p-, i- and n-type layers of which essentially consist of GaInAs, a high electron mobility transistor crystal, an electron donor layer of which essentially consists of AlInAs and active layer of which essentially consists of GaInAs, and a heterojunction bipolar transistor crystal, an emitter layer of which essentially consists of InP, and subcollector, collector, and base layers of which essentially consist of GaInAs, the pin photodiode, high electron mobility transistor, and heterojunction bipolar transistor crystals being formed on an InP semiconductor substrate according to the methods defined in claim 1 so as to satisfy the following conditions:

$$0.9d_6 < d_2 + d_3 < 1.1d_6$$

$$d_4 + d_5 < d_6$$

where
$d_2$ is a thickness of the base layer
$d_3$ is a thickness of the collector layer
$d_4$ is a thickness of the electron donor layer
$d_5$ is a thickness of the active layer
$d_6$ is a total thickness of the p- and i-type layers;

partially and simultaneously etching the emitter layer to partially expose the base layer;

partially and simultaneously etching the p-type layer, the i-type layer, the base layer, the collector layer, the electron donor layer, and the active layer to partially expose the n-type layer and the subcollector layer and to leave only a necessary region of the high electron mobility transistor crystal; and forming necessary electrodes on the p- and n-type layers, on the emitter, base, and subcollector layers, and on the electron donor layer.

9. A method of manufacturing a semiconductor integrated circuit, comprising the steps of:

forming a pin photodiode, n- and p-type layers of which essentially consist of InP and an i-type layer of which essentially consists of GaInAs, a high electron mobility transistor crystal, an electron donor layer of which essentially consists of AlInAs and an active layer of which essentially consists of GaInAs, and a heterojunction bipolar transistor crystal, subcollector and emitter layers of which essentially consist of InP and collector and base layers of which essentially consist of GaInAs, the pin photodiode, high electron mobility transistor, and heterojunction bipolar transistor crystal being formed on an InP semiconductor substrate;

partially and simultaneously etching the p-type and emitter layers to partially expose the i-type and base layers;

partially and simultaneously etching the i-type layer, the base layer, the collector layer, the electron donor layer, and the active layer to partially expose the n-type and subcollector layers and to leave only a necessary region of the high electron mobility transistor crystal; and forming necessary electrodes on the p- and n-type layers, on the emitter, base, and subcollector layers, and on the electron donor layer.

10. A method of manufacturing a semiconductor integrated circuit, comprising the steps of:

forming a pin photodiode crystal, an n-type layer of which essentially consists of InP and i- and p-type layers of which essentially consist of GaInAs, a high electron mobility transistor crystal, an electron donor layer of which essentially consists of AlInAs and an active layer of which essentially consists of GaInAs, and a heterojunction bipolar transistor crystal, subcollector and emitter layers of which essentially consist of InP and collector and base layers of which essentially consist of GaInAs;

partially and simultaneously etching the emitter layer to partially expose the base layer;

partially and simultaneously etching the p-type layer, the i-type layer, the base layer, the collector layer, the electron donor layer, and the active layer to partially expose the n-type and subcollector layers and leave only a necessary region of the high electron mobility transistor crystal; and forming necessary electrodes on the p- and n-type layers, on the emitter, base, and subcollector layers, and on the electron donor layer.

11. A method of manufacturing a semiconductor integrated circuit, comprising the steps of:

forming a pin photodiode crystal, a p-type layer of which essentially consists of InP and n- and i-type layers of which essentially consist of GaInAs, a high electron mobility transistor crystal, an electron donor layer of which essentially consists of AlInAs and an active layer of which essentially consists of GaInAs, and a heterojunction bipolar transistor crystal, an emitter layer of which essentially consists of InP, and subcollector, collector, and base layers of which essentially consist of GaInAs, the pin photodiode, the high electron mobility transistor, and heterojunction bipolar transistor crystal being formed on an InP semiconductor substrate so as to satisfy the following conditions:

$$0.9d_1 < d_2 + d_3 < 1.1d_1$$

$$d_4 + d_5 < d_1$$

where
$d_1$ is a thickness of the i-type layer
$d_2$ is a thickness of the base layer
$d_3$ is a thickness of the collector layer
$d_4$ is a thickness of the electron donor layer
$d_5$ is a thickness of the active layer;

partially and simultaneously etching the p-type and emitter layers to partially expose the i-type and base layers;

partially and simultaneously etching the i-type layers, the base layer, the collector layer, the electron donor layer, and the active layer to expose the n-type and subcollector layers and leave only a necessary region of the high electron mobility transistor; and forming necessary electrodes on the p- and n-type layers, on the emitter, base and subcollector layers, and on the electron donor layer.

12. A method of manufacturing a semiconductor integrated circuit, comprising the steps of:

forming a pin photodiode crystal, p-, i- and n-type layers of which essentially consist of GaInAs, a high electron mobility transistor crystal, an electron donor layer of which essentially consists of AlInAs and an active layer of which essentially consists of GaInAs, and a heterojunction bipolar transistor crystal, an emitter layer of which essentially consists of InP, and subcollector, collector and base layers of which essentially consist of GaInAs, the pin photodiode, high electron mobility transistor, and heterojunction bipolar transistor crystals being formed on an InP semiconductor substrate so as to satisfy the following conditions:

$$0.9d_6 < d_2 + d_3 < 1.1d_6$$

$$d_4 + d_5 < d_6$$

where
$d_2$ is a thickness of the base layer
$d_3$ is a thickness of the collector layer
$d_4$ is a thickness of the electron donor layer
$d_5$ is a thickness of the active layer
$d_6$ is a total thickness of the p- and i-type layers;

partially and simultaneously etching the emitter layer to partially expose the base layer;

partially and simultaneously etching the p-type layer, the i-type layer, the base layer, the collector layer, the electron donor layer, and the active layer to partially expose the n-type layer and the subcollector layer and to leave only a necessary region of the high electron mobility transistor crystal; and forming necessary electrodes on the p- and n-type layers, on the emitter, base, and subcollector layer, and on the electron donor layer.

* * * * *